United States Patent
Marty et al.

(10) Patent No.: US 7,687,833 B2
(45) Date of Patent: Mar. 30, 2010

(54) COMPONENT CONTAINING A BAW FILTER

(75) Inventors: Michel Marty, Saint Paul de Varces (FR); Jean-Christophe Giraudin, Bernin (FR); Philippe Coronel, Barraux (FR)

(73) Assignees: STMicroelectronics S.A., Montrouge (FR); STMicroelectronics Crolles 2 SAS, Crolles (FR)

( * ) Notice: Subject to any disclaimer, the term of this patent is extended or adjusted under 35 U.S.C. 154(b) by 303 days.

(21) Appl. No.: 11/807,491

(22) Filed: May 29, 2007

(65) Prior Publication Data
US 2007/0278469 A1 Dec. 6, 2007

(30) Foreign Application Priority Data
May 31, 2006 (FR) .................................. 06/51986

(51) Int. Cl.
*H01L 27/00* (2006.01)
(52) U.S. Cl. ........................ 257/254; 257/416
(58) Field of Classification Search ................ 257/254, 257/416, E29.001, 686
See application file for complete search history.

(56) References Cited

U.S. PATENT DOCUMENTS

| | | | | |
|---|---|---|---|---|
| 7,248,131 | B2 * | 7/2007 | Fazzio et al. | 333/187 |
| 7,402,449 | B2 * | 7/2008 | Fukuda et al. | 438/53 |
| 7,427,797 | B2 * | 9/2008 | Ohguro et al. | 257/415 |
| 7,514,760 | B1 * | 4/2009 | Quevy | 257/416 |
| 2003/0227357 | A1 | 12/2003 | Metzger et al. | |
| 2004/0164367 | A1 | 8/2004 | Park | |
| 2005/0001274 | A1 * | 1/2005 | Kim et al. | 257/414 |

OTHER PUBLICATIONS

French Search Report from French Patent Application 06/51986, filed May 31, 2006.

* cited by examiner

*Primary Examiner*—Allan R. Wilson
(74) *Attorney, Agent, or Firm*—Lisa K. Jorgenson; James H. Morris; Wolf, Greenfield & Sacks, P.C.

(57) ABSTRACT

A monolithic assembly of electronic components including a semiconductor substrate, at a first level above the substrate, at least one bulk acoustic wave resonator, at a second level above the resonator, a single-crystal semiconductor layer in which are formed semiconductor components, and recesses under the semiconductor layer portions arranged above the resonators.

16 Claims, 3 Drawing Sheets

US 7,687,833 B2

COMPONENT CONTAINING A BAW FILTER

BACKGROUND OF THE INVENTION

1. Field of the Invention

The present invention relates to the field of integrated circuits, and more specifically to an integrated circuit that can contain a bulk acoustic wave (BAW) filter or resonator.

2. Discussion of the Related Art

The forming of an integrated circuit containing among other components, a bulk or surface acoustic wave resonator poses many forming and assembly problems, especially due to the fact that acoustic wave resonators require specific materials (piezoelectric materials) not currently used in the field of integrated circuits, and due to the fact that a surface, currently the upper surface, of a resonator needs to be left free if the resonator is desired to vibrate properly. In some prior art devices, the resonator is placed on the upper side of a component and a space is created between this upper portion of the resonator and the package, which poses assembly problems.

SUMMARY OF THE INVENTION

The present invention aims at a novel structure assembling a resonator or a combination of resonators forming a bulk acoustic wave filter and other semiconductor components in a particularly simple and efficient fashion, without complicating the manufacturing of conventional semiconductor components, and without affecting the vibrations of the bulk acoustic wave filter.

The present invention applies to various circuits intended to transmit, receive, or filter a high frequency, for example, 0.9- and 2.4-GHz frequencies in cell phone circuits, but more generally any frequency of high value, possible greater than 10 GHz. Thus, it applies to many electronic circuits such as cell phones, computers, personal assistants, remote controls, walkmans.

To achieve all or part of these objects, as well as others, the present invention provides a monolithic assembly of electronic components comprising a substrate, at a first level above the substrate, at least one bulk acoustic wave resonator, at a second level above the resonator, a single-crystal semiconductor layer in which are formed semiconductor components, and recesses under the semiconductor layer portions arranged above the resonators.

According to an embodiment of the present invention, the substrate is a semiconductor substrate.

According to an embodiment of the present invention, the resonators are arranged above an assembly of layers forming a Bragg mirror.

According to an embodiment of the present invention, with each resonator or resonator assembly are associated a lower electrode and an upper electrode.

According to an embodiment of the present invention, the contacts with said upper and lower electrodes are ensured by vias running down from the component surface arranged on the side of said single-crystal semiconductor layer.

The present invention also provides a method for manufacturing an assembly of components comprising on the one hand bulk acoustic wave resonators, on the other hand semiconductor components such as transistors, formed from a first and a second wafer, comprising the steps of forming a first wafer comprising a substrate, at least one bulk acoustic wave resonator and an upper insulating layer comprising openings at locations at which contacts are desired to be established with upper and lower electrodes, and at locations arranged above the resonators; forming a second wafer containing semiconductor components and having a smooth upper surface, the upper surface of the second wafer comprising openings opposite to the locations at which contacts with said upper and lower electrodes are desired to be formed; and placing the upper surface of the first wafer against the upper surface of the second wafer.

According to an embodiment of the present invention, the manufacturing of the second wafer comprises the steps of forming, on a structure comprising a semiconductor substrate, an intermediary layer and a semiconductor layer, divided by insulating regions, additional insulating regions being provided at the locations which, after assembly, will be placed opposite to the openings in the first wafer above the contact areas, forming an insulating layer covering the semiconductor components and containing the various interconnect levels, assembling said structure with a handle wafer on the side of said insulating layer, striking off the initial substrate, digging openings opposite to the additional insulating regions.

According to an embodiment of the present invention, the intermediary layer is a silicon-germanium layer which is oxidized after elimination of the first substrate.

The foregoing and other objects, features, and advantages of the present invention will be discussed in detail in the following non-limiting description of specific embodiments in connection with the accompanying drawings.

DETAILED DESCRIPTION

Figure 1:
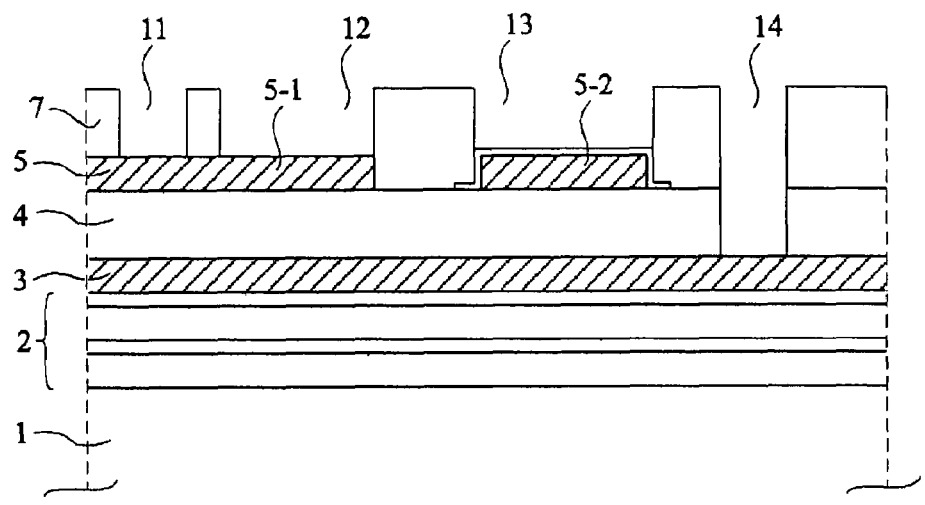
FIG. 1 is a cross-section view of a portion of a semiconductor wafer on which is formed a BAW filter according to an embodiment of the present invention.

For clarity, the same elements have been designated with the same reference numerals in the different drawings and, further, as usual in the representation of integrated circuits, the elements of the various drawings are not drawn to scale.

FIG. 1 shows a BAW filter formed on a semiconductor wafer. This structure is formed on a substrate 1 coated on at least a portion of its surface with a Bragg reflector 2 comprising an assembly of layers of different indexes, for example, an alternation of tungsten and silicon oxide layers or an alternation of silicon nitride and carbon-loaded silicon oxide (SiOC) layers. This reflector, which avoids that the acoustic waves propagate in the substrate, is topped with a conductive layer 3 which needs to be used as a first electrode for the BAW filter. A thin insulating layer (not shown) is inserted, if necessary, between the Bragg reflector and conductive layer 3. A piezoelectric layer 4, for example, aluminum nitride is then deposited and, on the upper surface side, a second electrode 5 is deposited. Electrodes 3 and 5 are for example made of molybdenum. Two portions 5-1 and 5-2 of the upper electrode have been shown above the piezoelectric layer. Portion 5-2 of the electrode is coated with an additional layer (it is said to be "loaded") to modify the resonance frequency of the piezoelectric material located thereunder. Thus, the two portions 5-1 and 5-2 cause bulk vibrations at different frequencies, which widens the frequency range and enables the system to operate as a filter.

This is an example only of a bulk acoustic wave system. In known fashion, many other materials and arrangements may be used. On the other hand, the resonator portion may form but a portion of the semiconductor wafer, other elements of different nature, for example, passive components such as capacitors, resistors, and inductances being possibly arranged at other locations of the wafer. It should be noted that, whatever the way in which the BAW resonators are formed, it is appropriate to leave above the active resonator portions, that is, above portions 5-1 and 5-2 illustrated in FIG. 1, a vacuum to avoid damping the vibrations.

On the wafer thus formed is deposited a relatively thick insulating layer 7, in which four openings are formed. An opening 11 exposes the upper surface of upper metallization 5, an opening 12 exposes the upper surface of the resonator portion corresponding to electrode 5-1, an opening 13 exposes the upper surface of the resonator portion corresponding to electrode 5-2, and an opening 14 exposes lower conductive layer 3 of the BAW filter. Various means may be provided by those skilled in the art to have access to lower electrode 3. According to a preferred embodiment, the piezoelectric layer is interrupted (or removed by etching) at the level where opening 14 is desired to be formed, before depositing insulating layer 7. Thus, opening 14 may be formed at the same time as openings 11, 12, 13.

For reasons which will be clarified hereafter, the upper surface of insulating layer 7 is carefully polished before forming of openings 11, 12, 13, 14. On the other hand, it should be noted that such openings actually only take up a small portion in top view of the semiconductor wafer surface.

After forming of the above-described wafer especially containing BAW components, a second wafer intended to contain conventional semiconductor components is formed separately.

Figure 2:
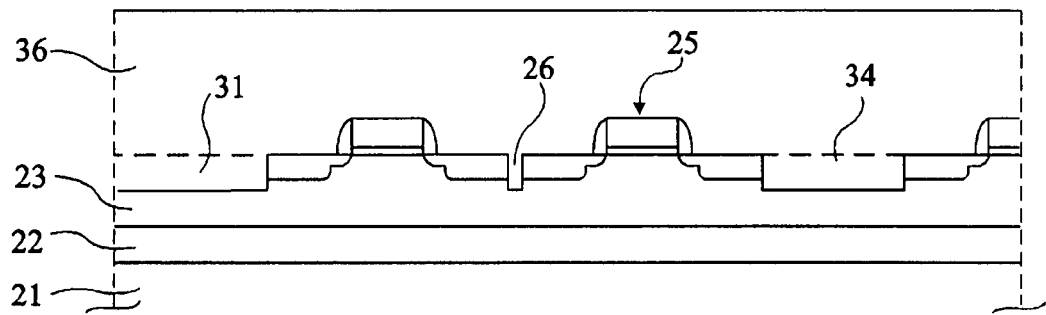
FIGS. 2 to 4 are successive cross-section views of a portion of a semiconductor wafer supporting various semiconductor components.
Figure 3:
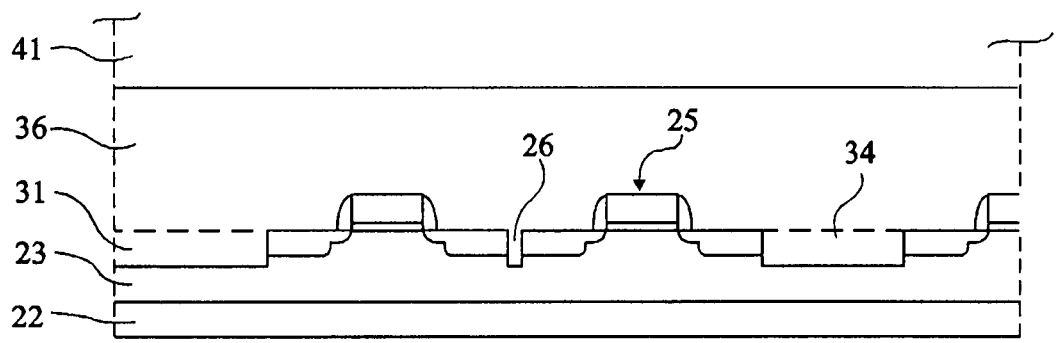
Figure 4:
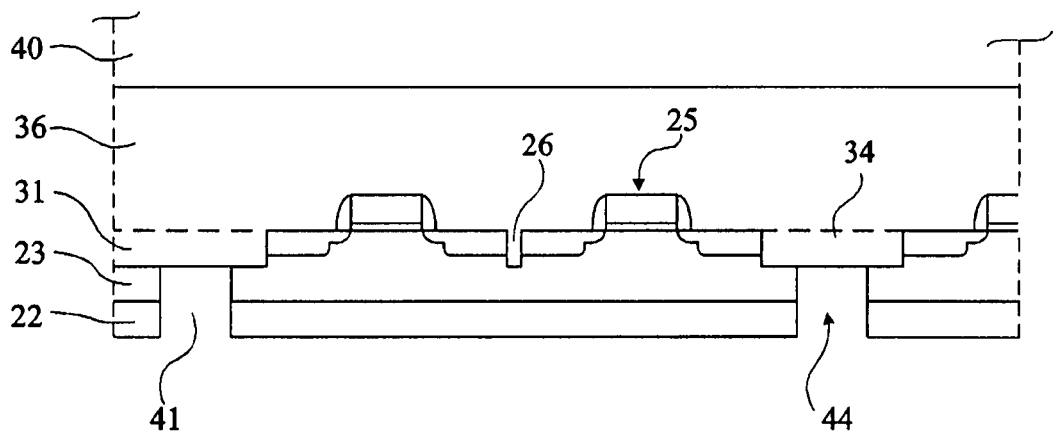

An example of implementation of the manufacturing of this second wafer will be detailed in relation with FIGS. 2 to 4.

As illustrated in FIG. 2, according to an embodiment, the second wafer is formed from a semiconductor substrate, for example a single-crystal silicon wafer 21, on which are successively formed an intermediary layer 22 and a single-crystal silicon layer 23. The assembly of substrate 21 and of layers 22 and 23 may result from the so-called silicon-on-insulator technology (SOI), in which case the intermediary layer is a silicon oxide layer. The structure may also be formed by growing by successive epitaxies on silicon substrate 21 a silicon-germanium layer (SiGe) and a silicon layer, both being single-crystal layers. Semiconductor components are conventionally formed in single-crystal silicon layer 23. MOS transistors 25 are drawn as an example. The MOS transistors are for example separated from one another by insulating regions 26 formed in recesses dug into the substrate. Such insulation regions, currently designated in the art as STI regions (shallow trench insulation), are well known and will not be described in detail.

According to an aspect of the present invention, at the same time as insulating regions 26 of insulation between components, insulating regions with a little greater extension, designated with reference numerals 31 and 34, having a function which will be explained hereafter, are formed. Then, the entire structure is coated with an alternation of insulation and metal layers intended to ensure the connections between components and to define an integrated circuit of selected configuration. This layer assembly is generally designated with reference numeral 36, the upper surface of this layer assembly corresponding to an insulating layer with a carefully leveled and polished surface.

As an example of orders of magnitude, silicon substrate 21 has a thickness on the order of 700 μm for a wafer of a 200-mm diameter, layer 22, in the case where it is SiGe, a thickness on the order of from 40 to 70 nm, silicon layer 23 has a thickness on the order of from 20 to 100 nm, and layer assembly 36 has a thickness from 1 to 2 μm.

In a next surface illustrated in FIG. 3, a silicon handle is "glued" on the upper surface of layer 36. Conventionally, a silicon wafer 41 having a carefully polished and oxidized surface is provided and the oxidized surface of the silicon wafer is applied against the upper surface of layer 36. This results in a molecular gluing of the two wafers. This gluing may be improved by appropriate thermal steps of consolidation of the Si—O links. Once this gluing has been performed, initial silicon wafer 21 is removed down to layer 22. This removal may, for example, be performed in two steps: In a first step, a simple burn in and in a second step, a selective chemical etch of the silicon with respect to the material of the intermediary layer, are performed. In the case where the intermediary layer is an SiGe layer, there is a very high etch selectivity for certain products, as shown for example by publication "Control of the Selectivity between SiGe and Si in Isotropic Etching Process" published in Japanese Journal of Applied Physics, Part 1, V. 43, N 6B, June 2004, PP 3964-3966.

The result of the next steps is illustrated in FIG. 4. First, in the case where the intermediary layer is not a silicon oxide layer, this layer is oxidized to transform at least its surface into an $SiO_2$ layer. It should be noted that, if the intermediary layer was an SiGe layer, the obtained $SiO_2$ surface will be particularly smooth and even. Then, openings 41 and 44 are dug into the assembly of layers 22 and 23, to reach insulating layers 31 and 34.

Figure 5:
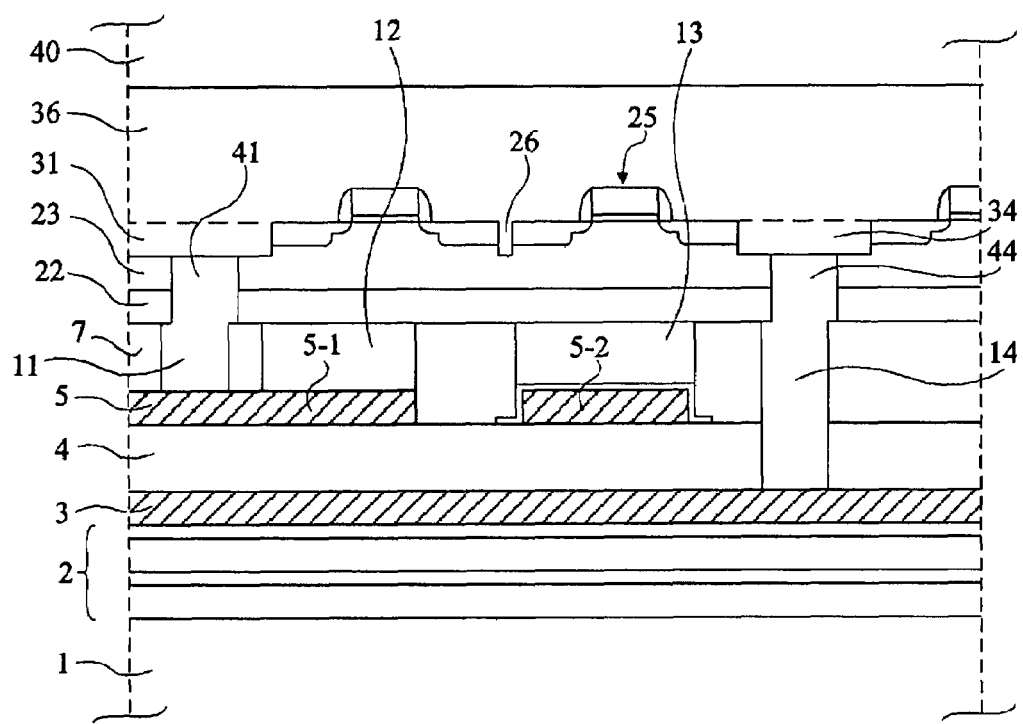
FIG. 5 shows the assembly of wafers of FIGS. 1 and 4.

Then, as illustrated in FIG. 5, the wafers respectively described in relation with FIG. 1 and in relation with FIG. 4 are assembled. The external surface of layer 7 of FIG. 1 is put in contact with the external surface of layer 22 of FIG. 4, to ensure a molecular binding between the two layers. The wafers are assembled so that layer 22 closes openings 12 and 13 and that openings 41 and 44 are opposite to openings 11 and 14.

Due to this assembly, it should be noted that there effectively exists a vacuum above metallizations 5-1 and 5-2 of the resonators described in relation with FIG. 1. Although term "vacuum" has been used herein, it should be understood that the concerned interval is effectively under low pressure or is filled with a selected gas, according to the conditions in which the assembly of the wafers of FIGS. 1 and 4 is formed.

Figure 6:
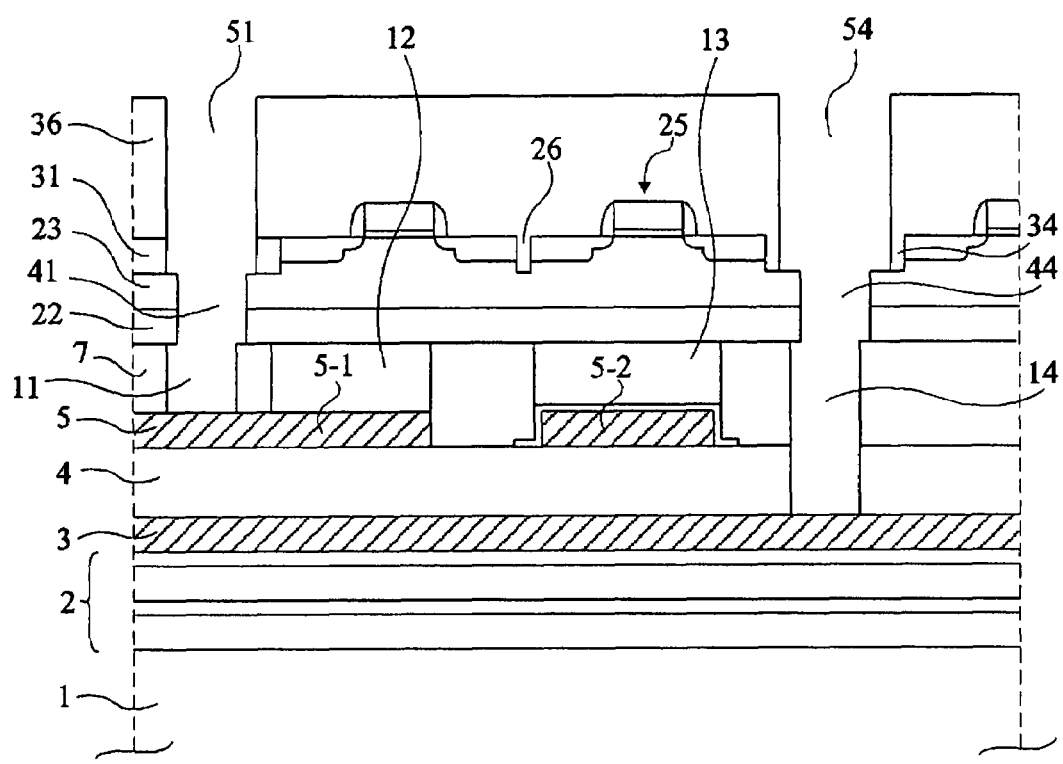
FIG. 6 shows a subsequent step of the manufacturing of a structure assembling conventional integrated circuits and a BAW filter according to an embodiment of the present invention.

In subsequent steps, the connections between the various devices are ensured. Thus, as shown by FIG. 6, it is started by eliminating upper wafer 40, to make the upper surface of layers assembly 36 apparent. Then, it is dug into layer assembly 36 (it should be reminded that this layer assembly results from the successive deposition of insulator and metal layers—however, at the locations where openings are formed, it will have been ascertained that there are insulator layers only). Openings 51 and 54 are thus dug into layer assembly 36 to reach layers 31 and 34 and the etching is carried on to pierce these layers to emerge into previously-formed openings 41-11 and 44-14. Openings 51-41-11 and 54-44-14 can thus be filled with a metal to obtain vias enabling respectively contacting upper and lower electrodes 5 and 3 of the BAW resonator.

Openings will then conventionally be formed in the upper portion of layer 36 to establish contacts with vias or portions of conductive layers underlying the insulating upper portion of layer assembly 36.

A component assembling conventional integrated circuits and BAW resonators has thus been obtained.

Of course, various alterations, modifications, and improvements will readily occur to those skilled in the art, especially as concerns the types of components that may be provided in the integrated circuit of the wafer described in relation with FIGS. 2 to 4. Especially, only MOS transistors have been mentioned. Bipolar transistors may further, or besides, be formed. Similarly, the BAW resonator structure has many variations. This resonator may be formed on a substrate other than silicon, for example, a ceramic, glass. On the other hand, it should be noted that a portion only of the extent of a wafer has been shown in the various drawings, and that other passive or active electronic components may be formed in the portions which have not been shown.

An assembly comprising a BAW resonator topped with a vacuum has been shown and described. The present invention applies to any other component to be topped with a vacuum, this vacuum being capable of being used for a mechanical, electric, acoustic, magnetic insulation, for example, a MEMS component, an inductance, an RF switch.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic assembly of electronic components comprising:
   a substrate;
   at a first level above the substrate, a resonator;
   at a second level above the resonator, a single-crystal semiconductor layer in which are formed semiconductor components; and
   a plurality of recesses under the single-crystal semiconductor layer, wherein a first recess of the plurality of recesses is arranged above a first portion of the resonator and a second recess of the plurality of recesses is arranged above a second portion of the resonator, and wherein the first portion is different from the second portion.

2. The monolithic assembly of claim 1, wherein the resonator is a bulk acoustic wave resonator.

3. The monolithic assembly of claim 1, wherein the substrate is a semiconductor substrate.

4. The monolithic assembly of claim 2, wherein the resonator is arranged above an assembly of layers forming a Bragg minor.

5. The monolithic assembly of claim 2, wherein with the resonator are associated a lower electrode and an upper electrode.

6. The monolithic assembly of claim 5, wherein contacts with said upper and lower electrodes are ensured by vias running down from a surface of the monolithic assembly arranged on the side of said single-crystal semiconductor layer.

7. An electronic product comprising at least one of a cell phone, a computer, a personal computer, a remote control, a walkman comprising the monolithic assembly of claim 2.

8. The monolithic assembly of claim 1, wherein the second portion of the resonator is coated with a layer so that the second portion of the resonator causes vibrations at frequencies different from frequencies of vibrations caused by the first portion of the resonator.

9. The monolithic assembly of claim 1, wherein the first and second recesses essentially form a vacuum above the first and second portions of the resonator.

10. The monolithic assembly of claim 1, wherein the first and second recesses are filled with at least one gas under a low pressure.

11. A circuit comprising:
    a substrate;
    above the substrate, a resonator associated with a lower electrode and an upper electrode;
    an insulting layer located above the resonator,
    a single-crystal semiconductor layer comprising semiconductor components; and
    a plurality of recesses under the single-crystal semiconductor layer, wherein a first recess of the plurality of recesses is arranged above a first portion of the resonator and a second recess of the plurality of recesses is arranged above a second portion of the resonator, wherein,
    the single-crystal semiconductor layer comprises a first opening extending through the insulting layer to the lower electrode and a second opening extending through the insulting layer to the upper electrode.

12. The circuit of claim 11, wherein the resonator comprises a bulk acoustic wave resonator.

13. An assembly of electronic components comprising:
    a first wafer, comprising:
       a substrate;
       at least one resonator arranged above the substrate and associated with a lower electrode and an upper electrode; and
       an upper insulating layer comprising a plurality of recesses; and
    a second wafer located above the first wafer, the second wafer comprising:
       a plurality of semiconductor components;
       an insulating layer above the plurality of semiconductor components, the insulating layers comprising:
          a first opening that extends from a surface of the insulating layer through the first wafer to the upper electrode, and
          a second opening that extends from the surface of the insulating layer of the second wafer through the first wafer to the lower electrode.

14. The assembly of claim 13, wherein the insulating layer of the second wafer comprises a single-crystal semiconductor layer.

15. The assembly of claim 13, wherein the plurality of recesses comprises a first recess arranged above a first portion of the resonator and a second recess is arranged above a second portion of the resonator.

16. The assembly of claim 15, wherein the first and second recesses essentially form a vacuum above the first and second portions of the resonator.

* * * * *

UNITED STATES PATENT AND TRADEMARK OFFICE
CERTIFICATE OF CORRECTION

PATENT NO. : 7,687,833 B2  Page 1 of 1
APPLICATION NO. : 11/807491
DATED : March 30, 2010
INVENTOR(S) : Michel Marty et al.

It is certified that error appears in the above-identified patent and that said Letters Patent is hereby corrected as shown below:

Claim 4, col. 5, line 55 should read:
Bragg mirror.

Signed and Sealed this

Eleventh Day of May, 2010

David J. Kappos
*Director of the United States Patent and Trademark Office*